United States Patent
Martinian et al.

(10) Patent No.: US 6,694,478 B1
(45) Date of Patent: Feb. 17, 2004

(54) LOW DELAY CHANNEL CODES FOR CORRECTING BURSTS OF LOST PACKETS

(75) Inventors: Emin Martinian, Medford, MA (US); Carl-Erik W. Sundberg, Chatham, NJ (US)

(73) Assignee: Agere Systems Inc., Allentown, PA (US)

( * ) Notice: Subject to any disclaimer, the term of this patent is extended or adjusted under 35 U.S.C. 154(b) by 418 days.

(21) Appl. No.: 09/707,686

(22) Filed: Nov. 7, 2000

(51) Int. Cl.$^7$ .................. H03M 13/03; H03M 13/00
(52) U.S. Cl. .................. 714/788; 714/752; 714/762; 714/776; 370/394; 370/412; 710/30
(58) Field of Search .................. 714/747, 748, 714/752, 776, 762, 781, 800, 788; 370/60, 82, 94.1, 80, 464, 347, 348, 81; 710/30

(56) References Cited

U.S. PATENT DOCUMENTS

| | | | | |
|---|---|---|---|---|
| 4,761,778 A | * | 8/1988 | Hui | 370/349 |
| 5,115,431 A | * | 5/1992 | Williams et al. | 370/394 |
| 5,572,521 A | * | 11/1996 | Pauwels et al. | 370/412 |
| 5,870,412 A | | 2/1999 | Schuster et al. | 714/752 |
| 6,173,431 B1 | * | 1/2001 | Rittle | 714/778 |
| 6,198,734 B1 | * | 3/2001 | Edwards et al. | 370/347 |

OTHER PUBLICATIONS

Ayanoglu, E., et al., "Diversity Coding for Transparent Self–Healing and Fault–Tolerant Communication Networks", IEEE Transactions on Communications, vol. 41, No. 11, Nov. 1993, pp. 1677–1685.

Amir, S., et al., "A New Fast and Efficient Image Codec Based on Set Partitioning in Hierarchical Trees", OEEE Transactions on Circuits and Systems for Video Technology, vol. 6, Jun. 1996.

* cited by examiner

*Primary Examiner*—Emmanuel L. Moise
(74) *Attorney, Agent, or Firm*—Kenneth M. Brown; Richard J. Botos

(57) ABSTRACT

A method and apparatus for coding and decoding a sequence of data packets with use of a novel class of forward error correcting codes having coding rates greater than 1/2 which nonetheless provide relatively high levels of channel protection against burst erasures with a relatively low decoding delay. In accordance with certain illustrative encoder embodiments of the present invention, the source information contained in each of a plurality of packets to be coded is similarly divided into a plurality of (similar) corresponding portions, and "checksums" are computed over multiple data packets, each such checksum being based on different (i.e., non-corresponding) portions of at least two of the multiple packets. These "checksums" are then advantageously appended to various subsequent data packets to be coded. By using different portions of multiple packets from which the checksums are computed, forward error correcting codes having rates greater than 1/2 which provide high levels of channel protection against burst erasures with relatively low decoding delays are advantageously provided. In accordance with illustrative decoder embodiments of the present invention, erased data packets may be regenerated based on the decoding of one or more subsequent (correctly received) data packets which include such appended "checksum" data.

20 Claims, 4 Drawing Sheets

FIG. 1
(PRIOR ART)

$\overline{y}[i]$ = | $x[i]$ | $x[i-3] \oplus x[i-2] \oplus x[i-1]$ $\overline{y}[i+1]$ = | $x[i+1]$ | $x[i-2] \oplus x[i-1] \oplus x[i]$ $\overline{y}[i+2]$ = | $x[i+2]$ | $x[i-1] \oplus x[i] \oplus x[i+1]$ $\overline{y}[i+3]$ = | $x[i+3]$ | $x[i] \oplus x[i+1] \oplus x[i+2]$ $\overline{y}[i+4]$ = | $x[i+4]$ | $x[i+1] \oplus x[i+2] \oplus x[i+3]$ $\overline{y}[i+5]$ = | $x[i+5]$ | $x[i+2] \oplus x[i+3] \oplus x[i+4]$ $\overline{y}[i+6]$ = | $x[i+6]$ | $x[i+3] \oplus x[i+4] \oplus x[i+5]$ $\overline{y}[i+7]$ = | $x[i+7]$ | $x[i+4] \oplus x[i+5] \oplus x[i+6]$

FIG. 2
(PRIOR ART)

$\overline{y}[i]$ = | $x[i]$ | $x[i-3]$ $\overline{y}[i+1]$ = | $x[i+1]$ | $x[i-2]$ $\overline{y}[i+2]$ = | $x[i+2]$ | $x[i-1]$ $\overline{y}[i+3]$ = | $x[i+3]$ | $x[i]$ $\overline{y}[i+4]$ = | $x[i+4]$ | $x[i+1]$ $\overline{y}[i+5]$ = | $x[i+5]$ | $x[i+2]$ $\overline{y}[i+6]$ = | $x[i+6]$ | $x[i+3]$ $\overline{y}[i+7]$ = | $x[i+7]$ | $x[i+4]$

FIG. 3

| $x_0[0]$ | $x_1[0]$ | 0 |
| $x_0[1]$ | $x_1[1]$ | $x_0[0]$ |
| $x_0[2]$ | $x_1[2]$ | $x_0[1] \oplus x_1[0]$ |
| $x_0[3]$ | $x_1[3]$ | $x_0[2] \oplus x_1[1]$ |

FIG. 4

| | | | |
|---|---|---|---|
| | $x_0[0]$ | $x_1[0]$ | 0 |
| | $x_0[1]$ | $x_1[1]$ | $x_0[0]$ |
| | $x_0[2]$ | $x_1[2]$ | $x_0[1] \oplus x_1[0]$ |
| SYMBOL ERASED — | $x_0[3]$ | $x_1[3]$ | $x_0[2] \oplus x_1[1]$ |
| DECODE $x_0[3]$ HERE — | $x_0[4]$ | $x_1[4]$ | $x_0[3] \oplus x_1[2]$ |
| DECODE $x_1[3]$ HERE — | $x_0[5]$ | $x_1[5]$ | $x_0[4] \oplus x_1[3]$ |

FIG. 5

| | | |
|---|---|---|
| $x_0[0]$ | $x_1[0]$ | 0 |
| $x_0[1]$ | $x_1[1]$ | 0 |
| $x_0[2]$ | $x_1[2]$ | $x_0[0]$ |
| $x_0[3]$ | $x_1[3]$ | $x_0[1]$ |
| SYMBOL ERASED → $x_0[4]$ | $x_1[4]$ | $x_0[2] \oplus x_1[0]$ |
| SYMBOL ERASED → $x_0[5]$ | $x_1[5]$ | $x_0[3] \oplus x_1[1]$ |
| DECODE $x_0[4]$ HERE → $x_0[6]$ | $x_1[6]$ | $x_0[4] \oplus x_1[2]$ |
| DECODE $x_0[5]$ HERE → $x_0[7]$ | $x_1[7]$ | $x_0[5] \oplus x_1[3]$ |
| DECODE $x_1[4]$ HERE → $x_0[8]$ | $x_1[8]$ | $x_0[6] \oplus x_1[4]$ |
| DECODE $x_1[5]$ HERE → $x_0[9]$ | $x_1[9]$ | $x_0[7] \oplus x_1[5]$ |

FIG. 6

| | | | |
|---|---|---|---|
| $x_0[0]$ | $x_1[0]$ | $x_2[0]$ | 0 |
| $x_0[1]$ | $x_1[1]$ | $x_2[1]$ | $P\{x_0[0], 0, 0, 0\}$ |
| $x_0[2]$ | $x_1[2]$ | $x_2[2]$ | $P\{x_0[1], x_0[0], 0, 0\}$ |
| SYMBOL ERASED → $x_0[3]$ | $x_1[3]$ | $x_2[3]$ | $P\{x_0[2], x_0[1], x_1[0], x_2[0]\}$ |
| SYMBOL ERASED → $x_0[4]$ | $x_1[4]$ | $x_2[4]$ | $P\{x_0[3], x_0[2], x_1[1], x_2[1]\}$ |
| RECOVER $x_0[3], x_0[4]$ HERE → $x_0[5]$ | $x_1[5]$ | $x_2[5]$ | $P\{x_0[4], x_0[3], x_1[2], x_2[2]\}$ |
| RECOVER $x_1[3], x_2[3]$ HERE → $x_0[6]$ | $x_1[6]$ | $x_2[6]$ | $P\{x_0[5], x_0[4], x_1[3], x_2[3]\}$ |
| RECOVER $x_1[4], x_2[4]$ HERE → $x_0[7]$ | $x_1[7]$ | $x_2[7]$ | $P\{x_0[6], x_0[5], x_1[4], x_2[4]\}$ |

FIG. 7

| | |
|---|---|
| $\bar{x}[0]$ | $\overbrace{0, 0, ..., 0}^{s\ 0's}$ |
| $\bar{x}[1]$ | $P\{x_0[0], \overbrace{0, 0, ..., 0}^{k+s\ 0's}\}$ |
| $\bar{x}[2]$ | $P\{x_0[1], x_0[0], \overbrace{0, 0, ..., 0}^{k+s\ 0's}\}$ |
| $\vdots$ | $\vdots$ |
| $\bar{x}[s]$ | $P\{x_0[s-1], x_0[s-2], ..., x_0[0], \overbrace{0, 0, ..., 0}^{k-1\ 0's}\}$ |
| $\bar{x}[s+1]$ | $P\{x_0[s], x_0[s-1], ..., x_0[1], x_1^s[0], \overbrace{0, 0, ..., 0}^{k-s-1\ 0's}\}$ |
| $\bar{x}[s+2]$ | $P\{x_0[s+1], x_0[s], ..., x_0[2], x_1^s[1], \overbrace{0, 0, ..., 0}^{k-s-1\ 0's}\}$ |
| $\vdots$ | $\vdots$ |
| $\bar{x}[2s]$ | $P\{x_0[2s-1], x_0[2s-2], ..., x_0[s], x_1^s[s-1], \overbrace{0, 0, ..., 0}^{k-s-1\ 0's}\}$ |
| $\bar{x}[2s+1]$ | $P\{x_0[2s], x_0[2s-1], ..., x_0[s+1], x_1^s[s], x_{s+1}^{2s}[0], \overbrace{0, 0, ..., 0}^{k-2s-1\ 0's}\}$ |
| $\bar{x}[2s+2]$ | $P\{x_0[2s+1], x_0[2s], ..., x_0[s+2], x_1^s[s+1], x_{s+1}^{2s}[1], \overbrace{0, 0, ..., 0}^{k-2s-1\ 0's}\}$ |
| $\vdots$ | $\vdots$ |
| $\bar{x}[3s]$ | $P\{x_0[3s-1], x_0[3s-2], ..., x_0[2s], x_1^s[2s-1], x_{s+1}^{2s}[s-1], \overbrace{0, 0, ..., 0}^{k-2s-1\ 0's}\}$ |
| $\bar{x}[3s+1]$ | $P\{x_0[3s], x_0[3s-1], ..., x_0[2s+1], x_1^s[2s], x_{s+1}^{2s}[s], x_{2s+1}^{3s}[0], \overbrace{0, 0, ..., 0}^{k-3s-1\ 0's}\}$ |
| $\bar{x}[3s+2]$ | $P\{x_0[3s+1], x_0[3s], ..., x_0[2s+2], x_1^s[2s+1], x_{s+1}^{2s}[s+1], x_{2s+1}^{3s}[1], \overbrace{0, 0, ..., 0}^{k-3s-1\ 0's}\}$ |
| $\vdots$ | $\vdots$ |
| $\bar{x}[ms+1]$ | $P\{x_0[ms], x_0[ms-1], ..., x_0[ms-s+1], x_1^s[(m-1)s], x_{s+1}^{2s}[(m-2)s], ..., x_{(m-1)s+1}^{ms}[0]\}$ |

US 6,694,478 B1

LOW DELAY CHANNEL CODES FOR CORRECTING BURSTS OF LOST PACKETS

FIELD OF THE INVENTION

The present invention relates generally to the field of error correcting codes for data transmission and more particularly to a packet loss recovery technique for use in data packet-based networks providing real-time multimedia communications.

BACKGROUND OF THE INVENTION

One of the most significant issues that must be dealt with in data packet-based communications networks such as, for example, the Internet, is the problem of error correction due to packet loss. Since each data packet is transmitted through the network independently (and potentially via entirely different network routes), it is common for a destination location to fail to receive an occasional sequence of one or more data packets, and to receive some such packets after an atypically substantial delay. And when such a network is employed to provide real-time multimedia communications such as, for example, voice communications, receiving some data packets after a substantial delay may be tantamount to not receiving them at all, since the receiver cannot typically wait to proceed with the processing of subsequent data packets.

A number of techniques, invariably involving some sort of redundancy coding, have been employed to address the general problem of error correction including the packet loss problem. Typically, the packet loss channel is recognized as an erasure channel using a channel coding language. Classical error correcting codes such as binary block codes, convolutional codes, and Reed Solomon codes, each familiar to those of ordinary skill in the art, can then be employed in an erasure correcting mode. (See, e.g., E. Ayanoglu et al., "Diversity Coding for Transparent Self-Healing and Fault-Tolerant Communication Networks," IEEE Transactions on Communications, vol. 41, no. 11, pp. 1677–1685, November, 1993; and R. Urbanke et al., "Methods and Apparatus for Packetizing Data for Transmission Through an Erasure Broadcast Channel," co-pending U.S. patent application, Ser. No. 08/892,855, filed Jul. 15, 1997 and assigned to the assignee of the present invention. U.S. patent application, Ser. No. 08/892,855, now U.S. Pat. No. 6,175,944, is hereby incorporated by reference as is fully set forth herein.) However, it is in fact considerably simpler to correct an erasure than to correct other types of errors (such as, for example, "random" modifications of one or more symbols). In the case of an error, the location of the error must first be determined, while in the case of an erasure (e.g., an unreceived data packet), the location is known.

Typically, a random error correcting code can correct about twice as many erasures as errors in a given block. However, in the context of a transmission of a sequence of data packets across a network, a packet loss effectively causes a continuous string (a "burst") of erased symbols. Since most classical channel codes are designed for the correction of random errors (or random erasures), prior art approaches to dealing with the packet loss problem typically perform some form of interleaving (permuting) on a relatively long sequence of packets. In this manner, a packet loss channel with correlated erasures (i.e., a continuous string of erased symbols) is transformed into an apparently random erasure channel. Unfortunately, performing such an interleaving process necessarily results in a significant delay at the destination, since the decoder must de-interleave the received data in order to recreate the original sequence of data packets.

Therefore, the use of channel codes such as, for example, Reed Solomon codes, when effectively applied across many packets in sequence, will necessarily require that relatively long delays be incurred at the receiver. As pointed out above, however, such delays may be prohibitive for real-time applications such as, for example, voice communication over networks based on the Internet protocol (IP). Recently, however, in U.S. Pat. No. 5,870,412 ("Forward Error Correction System for Packet Based Real Time Media") issued to G. M. Schuster et al. on Feb. 9, 1999 (hereinaiter, "Schuster et al."), a method for data recovery in a bursty packet network which incurs a relatively short delay (as compared to other prior art techniques) has been presented.

Specifically, Shuster et al. performs forward error correction by appending checksum information to each data packet, wherein the checksum information is defined by taking a bit-by-bit exclusive-or sum of the information portion (the "payload") from a preceding specified number of data packets. (Bit padding on the shorter payloads is used if the information payloads from the preceding packets are of unequal length.) By way of illustration, FIG. 1 shows an organization of an encoded data packet in accordance with the prior art packet loss recovery techniques as employed in Shuster et al. The illustrated data packet comprises coded information followed by checksum information which has been appended to the data packet for purposes of forward error correction. As described above, in the case of the Shuster et al. technique, the checksum information specifically comprises an exclusive-or sum of the information payload from a preceding specified plural number of data packets.

Thus, using the Shuster et al. technique, a single bit erasure correction code of length w+1 packet instances is formed, enabling for the correction of a burst of up to w lost data packets (provided such a burst is followed by a string of w correctly received data packets), with a maximum decoding delay of 2w−1 packets. Clearly, the Shuster et al. method incurs an overhead in bit volume of at least 100% (more if bit padding is required), as compared to the bits of the information payloads alone. In addition, it can be seen that the method of Shuster et al. requires the solution of w exclusive-or equations.

In co-pending U.S. patent application Ser. No. 09/425,143, "Packet Loss Control Method For Real-Time Multimedia Communications" by H-L. Lou and C-E. W. Sundberg, filed on Oct. 21, 1999 and commonly assigned to the assignee of the present invention (hereinafter, "Lou et al."), a significantly improved technique over that of Shuster et al. was provided. U.S. patent application Ser. No. 09/425,143 is hereby incorporated by reference as if fully set forth herein. By way of illustration, FIG. 2 shows an organization of an encoded data packet in accordance with the prior art packet loss recovery techniques as employed in Lou et al.

In particular, while Shuster et al. generates checksum information by "combining" (e.g., by performing exclusive-or operations on) the payload information from a plurality of preceding data packets, Lou et al. simply "repeats" information content from a particular one of the previous data packets in a later packet. More specifically, according to the technique of Lou et al , the information payload associated with a given data packet k, for example, might be identically copied and appended to data packet k+w. (That is, the information payload would be repeated with a delay of w transmitted packets.) Such an improved approach advantageously can correct for a burst of up to w lost data packets (as does the method of Shuster et al.) while improving the decoding delay to w packets as compared to the 2w−1 decoding delay required by the method of Shuster et al. In fact, it can be shown that the decoding delay required by the technique of Lou et al., relative to the number of consecutive lost packets that can be properly corrected, is in fact optimal. (Note that each of these prior art approaches append forward error correcting data to the existing packets without adding any additional packets.)

Both of the above-described prior art approaches (i.e., those of both Shuster et al. and the improved method of Lou et al.), however, are limited to providing rate 1/2 convolutional forward error correcting codes (FEC). (As is fully familiar to those of ordinary skill in the art, the "rate" of an error correcting code is determined based on the ratio between the total number of bits used to encode a given set of data being encoded, and the number of "information" bits which are being encoded therefrom.) Often, however, it is desirable to employ error correcting codes with rates which are greater than 1/2 for purposes of increased transmission efficiency. Therefore, it would be highly desirable to devise forward error correcting channel coding techniques having rates greater than 1/2, which, like the rate 1/2 technique of Lou et al., advantageously provide relatively high levels of channel protection against burst erasures with a relatively (if not optimally) low decoding delay, while still maintaining the existing number of transmitted packets and the existing packet structure.

SUMMARY OF THE INVENTION

In accordance with the principles of the present invention, a novel class of forward error correcting codes having coding rates greater than 1/2 are provided which provide high levels of channel protection against burst erasures with a relatively low decoding delay. In particular, a novel method of channel coding, in accordance with certain illustrative embodiments of the present invention comprises similarly dividing the source information (i.e., the data) contained in each packet to be coded into a plurality of (similar) corresponding portions, and then computing "checksums" over multiple data packets, each such checksum being based on different (i.e., non-corresponding) portions of at least two of the multiple packets. These "checksums" are then advantageously appended to various subsequent data packets to be coded (as in the above-described prior art techniques). However, by using different portions of multiple packets from which the checksums are computed, forward error correcting codes having rates greater than 1/2 which nonetheless provide relatively high levels of channel protection against burst erasures with relatively low decoding delays are advantageously provided. In accordance with illustrative decoder embodiments of the present invention, erased data packets may be regenerated based on the decoding of one or more subsequent (correctly received) data packets which include such appended "checksum" data.

More specifically, in accordance with the present invention, a method of coding a sequence of data packets representing a continuous stream of information is provided, wherein each data packet comprises a set of payload information representative of a segment of said stream of information corresponding thereto, each set of payload information having been similarly divided into a plurality of corresponding individual payload information portions, the method or apparatus comprising steps or means for coding a plurality of said data packets, said coding of each of said data packets comprising coding said set of payload information comprised therein by coding at least one of said plurality of individual payload information portions thereof; and coding an additional one of said data packets, said additional data packet being subsequent in said sequence to each of said plurality of data packets, said plurality of data packets thereby being previous to said additional data packet, said coding of said additional data packet comprising coding said set of payload information comprised therein, said coded additional data packet further comprising an added set of payload information which provides forward error correcting capability for said payload information comprised in said plurality of previous data packets, wherein said added set of payload information comprised in said coded additional data packet is based on a combination of said payload information comprised in two or more of said previous data packets, and wherein said payload information comprised in at least two of said previous data packets upon which said added set of payload information is based comprises payload information from different individual payload information portions thereof.

In addition, in accordance with the present invention, a method and apparatus for decoding a coded sequence of data packets in response to an erasure of one or more of said data packets in said sequence is provided, wherein said sequence of data packets has been coded with use of the above described coding technique, and wherein the method or apparatus comprises steps or means for decoding said coded additional one of said data packets, said additional one of said data packets being subsequent in said sequence to at least one of said erased data packets, to generate at least one of said individual payload information portions thereof representative of said forward error correcting data; and reproducing said at least one of said erased data packets based on at least said generated individual payload information portion of said decoded additional one of said data packets.

BRIEF DESCRIPTION OF THE DRAWINGS

FIG. 1 shows an organization of a sequence of encoded data packets which have been coded in accordance with a certain first prior art packet loss recovery technique.

FIG. 2 shows an organization of a sequence of encoded data packets which have been coded in accordance with a certain second prior art packet loss recovery technique.

FIG. 3 shows an illustrative zero state response of a code constructed in accordance with a first illustrative embodiment of the present invention.

FIG. 4 shows an organization of a sequence of encoded data packets which have been coded in accordance with a first illustrative embodiment of the present invention.

FIG. 5 shows an organization of a sequence of encoded data packets which have been coded in accordance with a second illustrative embodiment of the present invention.

FIG. 6 shows an organization of a sequence of encoded data packets which have been coded in accordance with a third illustrative embodiment of the present invention.

FIG. 7 shows a generalized view of an organization of a sequence of encoded data packets which have been coded in accordance with one general class of illustrative embodiments of the present invention.

DETAILED DESCRIPTION

Notation

For any symbol s, define $s^x$ as the string obtained by repeating s exactly x times (e.g., $\{00\}^2 = \{0000\}$). We denote the concatenation of two strings, a and b as a◊b (e.g., $\{01\} \diamond \{11\} = \{0111\}$). We use $\vec{e} = (\ldots, e_0, e_1, e_2, \ldots)$ to denote an erasure sequence where $e_i = 1$ if and only if the i'th symbol is erased. In general, for any vector $\vec{e}$, we use subscripts and superscripts together to denote the sub-vector from component i to component j as in $e_1^i = (e_i, e_{i+1}, \ldots, e_{j-1}, e_1)$. We will use the wild character, "*", to indicate that a particular symbol may be arbitrary (e.g., $\vec{e} = (1*1)$ refers to both (101) and (111)). We will use the notation "$\bar{0}$" to indicate that a particular symbol may be anything but 0 (e.g., $\vec{x} = (1\bar{0}2)$ could be (112) or (122) but not (102)).

A sequence of erasures, $e_{1+1}, e_{1+2}, \ldots, e_{1+s}$, is referred to as an "erasure burst" of length s relative to a "guard space" of length g if:

1. $e_{1+1} = e_{1+s} = 1$
2. The g symbols preceding $e_{1+1}$ and the g symbols following $e_{1+s}$ are all 0's.
3. The s symbols from $e_{1+1}$ through $e_{1-s}$ contain no subsequence of g 0's.

We will use $\vec{x}[i]$ to refer to information sequences and $\vec{y}[i]$ to refer to the corresponding encoded sequences. Let $\vec{x}[i]$ denote the information sent in symbol i. In accordance with certain illustrative embodiments of the present invention, in order to achieve a rate k/n error correcting code, we will advantageously divide $\vec{x}[i]$ into k equal units: $\vec{x}[i] = (x_1[i], x_2[i], \ldots x_k[i])$. Each unit is an element of $GF(2^r)$ with addition, ⊕, and multiplication, x̂, of units carried out according to the standard rules of finite field arithmetic, fully familiar to those of ordinary skill in the art. We shall use D to denote the delay operator. Thus an information sequence consisting of 2 non-zero symbols at time 0 and time 1 with all other symbols being 0 may be written as:

$$\vec{x}(D) = (x_0[0], x_1[0], \ldots, x_k[0]) + x_0[1], (x_1[2], \ldots, x_k[0])D$$

Similarly, the coded sequence for a corresponding repetition code may be written as:

$$\vec{y}(D) = (\vec{x}[0], \vec{x}[-1] + \vec{x}[1], \vec{x}[0])D + \vec{x}[2], \vec{x}[1])D^2$$

As is customary, we will use $\lfloor a \rfloor$ to denote the integer part of the real number a (for example, $\lfloor 3/2 \rfloor = 1$), and we will use $\lceil a \rceil$ to denote the next integer greater than or equal to the real number a (for example, $\lceil 3/2 \rceil = 2$).

We will use $d_H\{\vec{c}_1, \vec{c}_2\}$ to refer to the Hamming distance (familiar to those skilled in the art) between two symbols $\vec{c}_1$ and $\vec{c}_2$. Specifically, $d_H\{\vec{c}_1, \vec{c}_2\} = 0$ if and only if $\vec{c}_1$ and $\vec{c}_2$ are identical and 1 otherwise. We will use the same notation to refer to the Hamming distance between sequences. The Hamming distance between two sequences is defined as the sum of the distances between the symbols:

$$d_H\{\vec{c}(D), \vec{c}_2(D)\} \sum_i d_H\{\vec{c}_1[i], \vec{c}_2[i]\}$$

Note that the symbol size is relevant in evaluating the distance. For example, $$d_H\{(10)+(01)(D)(D), (01)+(11)D\} = 2$$

but $$d_H\{(1)+(0)D+(0)D^2+(1)D^3, (0)+(1)D+(1)D^2+(1)D^3\} = 3.$$

Review of Certain Prior Art Techniques in Relation to Certain Advantageous Criteria There exist a large class of potential channels which qualify as burst erasure channels and various metrics may be appropriate to characterize the quality of a given forward error correcting code for a general channel. As one generally useful criteria, however, it is often advantageous to evaluate an error correcting code by measuring the longest erasure burst that can be corrected by the given code for a given delay and guard space. Thus, in accordance with the principles of the present invention, we expressly define our "goal" to be that of reliably transmitting information over a burst erasure channel (i.e., a channel which tends to experience multiple consecutive erasures) with a fixed (and preferably minimal) decoding delay constraint.

FIG. 1 shows an organization of a sequence of encoded data packets which have been coded in accordance with the prior art packet loss recovery technique described in Shuster et al. The specific technique described therein is designed to correct erasure bursts of length 3 (for example) with a rate 1/2 systematic error correcting code. Clearly, to use a rate 1/2 code and maintain the same information rate, the packet payload size must be doubled. The information bits are grouped into symbols, x[i], occupying the "left" (i.e., the first) half of the packet payload and the parity check bits are grouped into symbols occupying the "right" (i.e., the second) half of the packet payload. As can be seen, for example, from FIG. 1, the rule to create the i'th coded packet in accordance with the technique of Shuster et al. is:

$$y_0[i] = x[i]$$

$$y_1[i] = x[i-3] \oplus x[i-2] \oplus x[i-1]$$

As can also be seen from the figure, if packets $\vec{y}[i+1]$, $\vec{y}[i+2]$, and $\vec{y}[i+3]$ are lost due to a burst of length 3, the corresponding information symbols can be recovered once $\vec{y}[i+4]$, $\vec{y}[i+5]$, and $\vec{y}[i+6]$ are received by solving the parity check equations as shown below:

$$x[i+5] = y_1[i+5]$$
$$x[i+4] = y_1[i+4]$$
$$x[i+3] = y_1[i+6] \oplus x[i+5] \oplus x[i+4]$$
$$x[i+2] = y_1[i+5] \oplus x[i+4] \oplus x[i+3]$$
$$x[i+1] = y_1[i+4] \oplus x[i+3] \oplus x[i+2]$$

Thus x[i+1] may be recovered once $\vec{y}[i+6]$ has been received, thereby resulting in a decoding delay of 5.

FIG. 2 shows an organization of a sequence of encoded data packets which have been coded in accordance with the prior art packet loss recovery technique disclosed in Lou et al. In particular, Lou et al. proposes a code referred to as the "duplicate and delay" code. Note specifically that if packets $\vec{y}[i+1]$, $\vec{y}[i+2]$, and $\vec{y}[i+3]$ are lost due to an erasure burst of length 3, the corresponding information symbols can be recovered once $\vec{y}[i+4]$, $\vec{y}[i+5]$, and $\vec{y}[i+6]$ are received, since $$x[i+1] = y_1[i+4], x[i+2] = y_1[i+5], x[i+3] = y_1[i+6].$$

Note that x[i+j] is recovered from $y_1[i+j+3]$ for $j\in\{1,2,3\}$. Thus, the decoding delay of the technique of Lou et al. is advantageously only 3, as opposed to the decoding delay of 5 required for the technique disclosed in Shuster et al. Therefore, it can be seen that the simple duplicate and delay code is "superior" (in terms of our adopted criteria or "goal") to the code disclosed in Shuster et al.—whereas both codes can correct a burst of 3 erasures, the duplicate and delay code has a shorter decoding delay.

An Overview of a Class of Illustrative Embodiments of the Present Invention

In accordance with the principles of the present invention, a technique which provides for the construction of a class of systematic, linear, time-invariant, convolutional codes which are advantageously "maximally short" is described herein. We call these codes "maximally short" (MS) because they advantageously have the shortest possible decoding delay and the shortest possible guard length for a given erasure burst length. Although this technique provides for a class of codes having various coding rates greater than 1/2, in order to introduce some further notation and to illustrate certain key ideas, a pair of 2/3 rate codes in accordance with first and second illustrative embodiments of the present invention, as well as a rate 3/5 code in accordance with a third illustrative embodiment of the present invention, will be presented in detail herein before the general class of illustrative codes is described.

In particular, we will describe how to advantageously construct MS codes for all rates of the form $R=(ms+1)/(ms+1+s)$, where m and s are arbitrary positive integers. We will refer to the rate $(ms+1)/(ms+1+s)$ code as MS(m,s). It can be shown that these codes are advantageously capable of correcting erasure bursts of length s with a guard length (g) and a decoding delay (T) as follows:

$$g=T=ms+1.$$

In accordance with certain illustrative embodiments of the present invention, we also disclose a simple periodic interleaving technique which corresponds to sampling by a given factor, $\lambda$. It can be shown that by interleaving in the proposed manner, an MS(m,s) code developed in accordance with the principles described herein, which is capable of correcting erasure bursts of length s with guard length g and decoding delay T, may be advantageously transformed into a related code which is capable of correcting erasure bursts of length $\lambda s$ with a corresponding guard length of $\lambda g$ and a decoding delay of $\lambda T$.

The illustrative construction in accordance with the present disclosure advantageously makes extensive use of systematic, linear, maximum distance separable (MDS) block codes. MDS codes, which are fully familiar to those of ordinary skill in the art, are useful building blocks because MDS codes with useful properties can be constructed as Reed-Solomon codes. (Reed-Solomon codes are also fully familiar to those of ordinary skill in the art.) Specifically, it is well known that linear, systematic, Reed-Solomon codes can be constructed for all values of (n, k, d=n−k+1) using q-ary symbols over $GF(q=2^r)$.

A Rate 2/3 Code in Accordance with a First Illustrative Embodiment

When considering linear, time-invariant convolutional codes, a useful tool is the zero state response (ZSR), fully familiar to those of ordinary skill in the art, which is the output of an encoder that starts in the all 0 state. We can completely specify a code using the zero state response to an input which is non-zero only at time 0 ($ZSR_0$). However, it is usually easier to analyze a code by writing out the ZSR for a stream of input symbols instead of just an input at time 0. For example, consider a rate 2/3 parity check code in accordance with a first illustrative embodiment of the present invention. Specifically, this illustrative code, which will be referred to as MS(1,1), is defined as having the following $ZSR_0$:

$$\vec{y}(D)=(x[0],x_1[0],0)+(0, 0, x_0[0])D+(0, 0, x_1[0]), D^2$$

FIG. 3 shows an illustrative zero state response of a code constructed in accordance with this first illustrative embodiment of the present invention. In particular, the ZSR for a stream of information symbols starting at time 0 is shown in the figure.

FIG. 4 shows an organization of a sequence of encoded data packets which have been coded in accordance with the first illustrative embodiment of the present invention, as specifically defined in terms of the ZSR shown in FIG. 3. From FIG. 4 it can be seen that this illustrative MS(1,1) code can advantageously correct an erasure burst of length 1 with a guard space of 2 and a decoding delay of 2. Consider, for example, the situation explicitly shown in the figure where the coded symbol $\vec{y}[3]$ is erased. To recover $x_0[3]$ the decoder advantageously waits until $$\vec{y}[4]=(x_0[4], x_1[4], x_0[3]\oplus x_1[2])$$

is received, and it then recovers $x_0[3]$ using $x_0[3]=y_3[4]\oplus(-x_1[2])$. Similarly, $x_1[3]$ is recovered from $\vec{y}[5]$ using $x_1[3]=y_3[5]\oplus(-x_0[4])$.

Clearly, the decoding delay required for this first illustrative embodiment of the present invention is T=2. The guard space required is g=2 because the decoding "rule" only requires that the 2 symbols after the erasure and the 1 symbol preceding the erasure are unerased. Note that it can easily be shown that the illustrative MS(1,1) code is advantageously "optimal" in terms of these adopted criteria.

An Interleaved Rate 2/3 Code in Accordance with a Second Illustrative Embodiment Admittedly, a code which corrects only 1 erasure does not meet the intuitive meaning of a "burst erasure" correction code. However, by using degree $\lambda$ periodic interleaving, an s erasure burst correcting code having guard length and decoding length g and T, respectively, and derived in accordance with the principles of the present invention, may be advantageously transformed into a $\lambda s$ erasure burst correcting code having guard length and decoding delay $\lambda g$ and $\lambda T$, respectively. Specifically, such an interleaving process, which may be advantageously used in accordance with a second illustrative embodiment of the present invention, is simply upsampling. In particular, given a code with $ZSR_0$ $\vec{y}(D)$, the $\lambda$-upsampled "version" of the given code has $ZSR_0$ $\vec{y}(D^\lambda)$.

FIG. 5 shows an organization of a sequence of encoded data packets which have been coded in accordance with a second illustrative embodiment of the present invention in which the MS(1,1) code (i.e., the rate 2/3 code of the first illustrative embodiment of the present invention) has been upsampled by $\lambda=2$ to obtain $ZSR_0$ $$\vec{y}(D^2)=(x_0[0], x_1[0], 0)(0, 0x_1[0])D^4.$$

Note that in accordance with this second illustrative embodiment of the present invention, if a burst of 2 erasures starts at, for example, time t=4, then the erased symbols can be recovered in a manner similar to that described above in connection with the first illustrative embodiment of the present invention (i.e., the non-upsampled rate 2/3 code). Note also that the decoding delay and guard length required for the upsampled code are clearly twice that required for the "base" code. Thus, the upsampled code in accordance with the second illustrative embodiment is a rate 2/3 code with g/s=T/s=4/2=2, which is also advantageously "optimal" in terms of the adopted criteria.

It will be obvious to those of ordinary skill in the art that, in general, MS(m,1) codes of rate R=(m+1)/{m+2} can be advantageously constructed in accordance with the principles of the present invention for any value of m≧1 using single parity check codes similar to the one described above in the discussion of the first illustrative embodiment of the present invention (i.e., the rate 2/3 code). It will also be obvious to those skilled in the art that these codes will have decoding delay T=m+1, and will require a guard space of g=m+1. Such codes advantageously meet the "optimality" criteria discussed above and adopted herein. Moreover, and also in accordance with the principles of the present invention, these codes may be advantageously upsampled by any multiple λ=s in order to produce codes which correct erasure bursts of length s for any s≧1. Clearly, these codes also advantageously meet the "optimality" criteria discussed above and adopted herein.

A Rate 3/5 Code in Accordance with a Third Illustrative Embodiment

Note that the MS(1,1) code as defined above in accordance with the first illustrative embodiment of the present invention is based upon a (3,2) single parity check (SPC) block code, which is fully familiar to those of ordinary skill in the art. Note also, however, with reference for example to FIG. 4, that the parity check symbols are not computed on "rows" or "columns," of symbols, but rather, are advantageously computed on "diagonals" of symbols. To generalize the MS(1,1) code to coding rates other than 2/3 in such a way so as to maintain its desirable performance characteristics, we advantageously maintain the idea of using block codes computed across packets, but move to using maximum distance separable (MDS) block codes (also fully familiar to those of ordinary skill in the art) instead of using SPC block codes. Specifically, let C be a systematic, (n, k, d)=(6,4,3) block code. (Note that it will be fully familiar to those skilled in the art that a (6,4,3) MDS code can be constructed by first constructing an (8,4,5) systematic Reed-Solomon code over $GF(2^3)$ and then puncturing the last two parity check symbols.) We denote the 2 parity check symbols of C corresponding to the 4 information symbols $(x_0, x_1, x_2, x_3)$ as $P\{x_0, x_2, x_3\}$.

The $ZSR_0$ for the rate 3/5, MS(1,2) code in accordance with a third illustrative embodiment of the present invention is $$\vec{y}(D)=(x_0[0], x_1[0], x_2[0], 0,0)+(0, 0, 0, P\{x_0[0], x_0[1]0, 0\})D^2 + (0, 0, 0P\{0, 0, x_1[0], x_2[0]\})D^3$$

FIG. 6 shows an organization of a sequence of encoded data packets which have been coded in accordance with a third illustrative embodiment of the present invention, based on this illustrative MS(1,2) code and on the above $ZSR_0$. The figure also shows an illustrative process of decoding a given erasure burst of length 2. As can be seen in the figure, the illustrated erasure burst erases the coded symbols $\vec{y}[3]$ and $\vec{y}[4]$. In accordance with the principles of the present invention, the decoder advantageously waits until $\vec{y}[5]$ is received, and then uses the decoding algorithm for C to recover $x_0[3]$ and $x_0[4]$ from $y_{3,4}[5]=P\{x_0[4], x_0[3], x_1[2], x_2[2]\}$. Since C has minimum distance 3 and (illustratively) we have assumed herein that neither $x_1[2]$ nor $x_2[2]$ were erased, $x_0[3]$ and $x_0[4]$ can be successfully recovered. Next, the decoder receives $\vec{y}[6]$, and then advantageously uses it to decode $x_{1,2}[3]$ from $y_{3,4}[6]=P\{x_0[5], x_0[4], x_1[3], x_2[3]\}$. Since $x_0[4]$ was recovered at the previous step and since $x_0[5]$ was uncreased, $x_{1,2}[3]$ can be successfully recovered. Finally, when the decoder receives $y_{3,4}[7]=P\{x_0[6], x_0[5], x_1[4], x_2[4]\}$, it can advantageously recover $x_{1,2}[4]$, since $x_0[5]$ and $x_0[6]$ were also (illustratively) unerased.

By inspecting FIG. 6 it can be easily seen that for an erasure burst of length 2 starting at time t, the illustrative decoding rule as described herein requires that symbols t+2, t+3, and t−1 be unerased. Therefore the guard space required is clearly g=2. Similarly, it can be seen that the decoding delay will also be T=2. These values meet the "optimality" criteria as described above (and therefore the illustrative MS(1,2) code as described is, in fact, "maximally short").

In accordance with another illustrative embodiment of the present invention, the MS(1,2) code can be advantageously upsampled in an analogous manner to the upsampling of the MS(1,1) performed in accordance with the second illustrative embodiment of the present invention. In particular, the MS(1,2) may be upsampled by λ to obtain a rate 3/5 code which corrects erasure bursts of length sλ relative to a guard space of gλ and with a decoding delay of Tλ. (Note that again, since the "base" code is maximally short, the upsampled codes will also advantageously be maximally short.)

A Generalized Class of Illustrative Embodiments of the Present Invention

FIG. 7 shows a generalized view of an organization of a sequence of encoded data packets which have been coded in accordance with one general class of illustrative embodiments of the present invention. In particular, a technique for constructing general MS(m,s) codes for all m≧1 and all s≧1 in accordance with the principles of the present invention is described below. Based on such a construction, a class of illustrative encoder and decoder embodiments of the present invention may be advantageously derived. It is to be noted that, like the MS(1,1) and MS(1,2) codes described above, these generalized MS(m,s) codes (as well as all upsampled "versions" thereof) are all "maximally short" and thereby "optimal" in terms of the above-identified and adopted criteria. In particular, all of the MS(m,s) codes constructed by this illustrative procedure have rate R=(ms+1)/(ms+1+s), and they can advantageously correct erasure bursts of length s relative to a guard space of g=ms+1 with a decoding delay of T=ms+1.

Specifically, to construct an illustrative MS(m,s) code in accordance with the principles of the present invention, we first construct a systematic, MDS, block code, C, with parameters (n, k, d)=(2s+k−1, k+s−1, s+1). Note that C can always be advantageously constructed by choosing r=⌈log$_2$ (2s+k−1)⌉ and puncturing a systematic ($2^r$, k+s−1, $2^r$−k−s+2) Reed-Solomon code over GF($2^r$). It is well known to those of ordinary skill in the art that Reed-Solomon codes over GF($2^r$) can be constructed for all (n≦$2^r$, k≦n, n−k+1). Groups of r bits may be mapped to individual symbols for this code. If the packet size is not a multiple of r bits, some padding may be advantageously added at the end of the packet.

Now let $P\{x_0, x_1, \ldots, x_k\}$ be the n−k=s parity check symbols for C. Then, the $ZRS_0$ for the MS(m,s) code is:

$$\vec{y}(D) = \left(x_0^{ms}[0], \overline{0, 0, \ldots, 0}^{s0's}\right) +$$

$$\sum_{i=0}^{s-1} \left(\overline{0, 0, \ldots, 0}^{k0's}, P\left(\overline{0, 0, \ldots, 0}^{t0's}, x_0[0], \overline{0, 0, \ldots, 0}^{k+s-2-t0's}\right)\right) D^{i+1} +$$

$$\sum_{i=0}^{m-1} \left(\overline{0, 0, \ldots, 0}^{k0's}, P\left(\overline{0, 0, \ldots, 0}^{(i+1)s0's}, x_{is+1}^{(i+1)s-1}[0], \overline{0, 0, \ldots, 0}^{k+s-2-t0's}\right)\right) D^{(i+1)s+1}$$

Given the $ZSR_0$ shown above, it will be obvious to those of ordinary skill in the art that a general class of MS(m,s) codes can be derived in accordance with the principles of the present invention. Illustrative encoder and decoder embodiments of the present invention may then be easily derived therefrom. By examining the above $ZSR_0$ and the illustrative encoding as shown in FIG. 7, it can specifically be seen that the coded symbol at time i is:

$$\vec{y}[i] = x_0^{ms}[i], P\{x_0[i-1], x_0[i-2], \ldots, x_0[i-s], x_1^s[i-s-1], x_{s+1}^{2s}[i-2s-1], \ldots, x_{(m-1)s+1}^{ms}[i-ms-1]\})$$

Note that, in particular, the MS(0,s) codes as defined in the above manner, are rate 1/(s+1) repetition codes, such as is the delay and duplicate code disclosed in Lou et al. (which is, in particular, a 1/2 repetition code). In general, MS codes for rates less than or equal to 1/2 are repetition codes, whereas, in accordance with various illustrative embodiments of the present invention, MS codes for rates greater than 1/2 advantageously involve the computation of an appropriate "checksum." Consequently, MS codes generally, can in some sense be viewed as a "generalization" of delay and duplicate codes. Note, for example, that the illustrative rate MS(m,1) codes are rate (m+1)/(m+2) single parity check convolutional codes where the parity check is computed over diagonals such as in the illustrative 2/3 rate code described above and shown in FIG. 4.

Addendum to the Detailed Description

It should be noted that all of the preceding discussion merely illustrates the general principles of the invention. It will be appreciated that those skilled in the art will be able to devise various other arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future—i.e., any elements developed that perform the same function, regardless of structure.

Thus, for example, it will be appreciated by those skilled in the art that the block diagrams herein represent conceptual views of illustrative circuitry embodying the principles of the invention. Similarly, it will be appreciated that any flow charts, flow diagrams, state transition diagrams, pseudocode, and the like represent various processes which may be substantially represented in computer readable medium and so executed by a computer or processor, whether or not such computer or processor is explicitly shown.

The functions of the various elements shown in the figures, including functional blocks labeled as "processors" or "modules" may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitations digital signal processor (DSP) hardware, read-only memory (ROM) for storing software, random access memory (RAM), and non-volatile storage. Other hardware, conventional and/or custom, may also be included. Similarly, any switches shown in the Figs. are conceptual only. Their function may be carried out through the operation of program logic, through dedicated logic, through the interaction of program control and dedicated logic, or even manually, the particular technique being selectable by the implementer as more specifically understood from the context.

In the claims hereof any element expressed as a means for performing a specified function is intended to encompass any way of performing that function including, for example, (a) a combination of circuit elements which performs that function or (b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent (within the meaning of that term as used in 35 U.S.C. 112, paragraph 6) to those explicitly shown and described herein.

What is claimed is:

1. A method of coding a sequence of data packets representing a continuous stream of information, each data packet comprising a set of payload information representative of a segment of said stream of information corresponding thereto, each set of payload information having been similarly divided into a plurality of corresponding individual payload information portions, the method comprising the steps of:

coding a plurality of said data packets, said coding of each of said data packets comprising coding said set of payload information comprised therein by coding at least one of said plurality of individual payload information portions thereof; and coding an additional one of said data packets, said additional data packet being subsequent in said sequence to each of said plurality of data packets, said plurality of data packets thereby being previous to said additional data packet, said coding of said additional data packet comprising coding said set of payload information comprised therein, said coded additional data packet further comprising an added set of payload information which provides forward error correcting capability for said payload information comprised in said plurality of previous data packets, wherein said added set of payload information comprised in said coded additional data packet is based on a combination of said payload information comprised in two or more of said previous data packets, and wherein said payload information comprised in at least two of said previous data packets upon which said added set of payload information is based comprises payload information from different individual payload information portions thereof.

2. The method of claim 1 wherein said sets of payload information comprised in each data packet to be coded have been similarly divided into m corresponding individual payload information portions where m is an integer greater than one, and wherein said added set of payload information comprised in said coded additional data packet comprises a checksum of m different individual payload information portions of m of said plurality of data packets, said checksum based upon a single parity check block code, thereby resulting in a rate m/(m+1) forward error correcting code.

3. The method of claim 2 wherein m is equal to 2 and wherein said added set of payload information comprised in said coded additional data packet comprises a checksum of a first individual payload information portion of a first one of said plurality of data packets and a second individual payload information portion of a second one of said plurality of data packets, thereby resulting in a rate 2/3 forward error correcting code.

4. The method of claim 1 wherein said sets of payload information comprised in each data packet to be coded have been similarly divided into m corresponding individual payload information portions where m is an integer greater than one, and wherein said added set of payload information comprised in said coded additional data packet comprises a checksum based upon a maximum distance separable block code.

5. The method of claim 1 wherein said added set of payload information comprised in said additional one of said data packets is interleaved with one or more other added sets of payload information which are based on data packets other than said two or more of said previous data packets.

6. A method of decoding a coded sequence of data packets in response to an erasure of one or more of said data packets in said sequence, said sequence of data packets representing a continuous stream of information and including coded forward error correcting data therefor, each coded data packet comprising a set of payload information similarly divided into a plurality of corresponding individual payload information portions thereof, two or more of said individual payload information portions of each data packet representative of a corresponding segment of said stream of information and another one or more of said individual payload portions of each data packet representative of said forward error correcting data, the coded sequence of data packets having been coded by (a) coding a plurality of said data packets, said coding of each of said data packets comprising coding said set of payload information comprised therein by coding at least one of said plurality of individual payload information portions thereof, and (b) coding an additional one of said data packets, said additional data packet being subsequent in said sequence to each of said plurality of data packets, said plurality of data packets thereby being previous to said additional data packet, said coding of said additional data packet comprising coding said set of payload information comprised therein, said coded additional data packet further comprising an added set of payload information representative of said forward error correcting data capability for said payload information comprised in said plurality of previous data packets, wherein said added set of payload information comprised in said coded additional data packet is based on a combination of said payload information comprised in two or more of said previous data packets, and wherein said payload information comprised in at least two of said previous data packets upon which said added set of payload information is based comprises payload information from different individual payload information portions thereof, the method of decoding comprising the steps of:
  decoding said coded additional one of said data packets, said additional one of said data packets being subsequent in said sequence to at least one of said erased data packets, to generate at least one of said individual payload information portions thereof representative of said forward error correcting data; and
  reproducing said at least one of said erased data packets based on at least said generated individual payload information portion of said decoded additional one of said data packets.

7. The method of claim 6 wherein said sets of payload information comprised in each coded data packet have been similarly divided into m corresponding individual payload information portions where m is an integer (greater than one, and wherein said added set of payload information comprised in said coded additional data packet comprises a checksum of m different individual payload information portions of m of said plurality of data packets, said checksum based upon a single parity check block code, thereby resulting in a rate m/(m+1) forward error correcting code.

8. The method of claim 7 wherein m is equal to 2 and wherein said added set of payload information comprised in said coded additional data packet comprises a checksum of a first individual payload information portion of a first one of said plurality of data packets and a second individual payload information portion of a second one of said plurality of data packets, thereby resulting in a rate 2/3 forward error correcting code.

9. The method of claim 6 wherein said sets of payload information comprised in each coded data packet have been similarly divided into m corresponding individual payload information portions where m is an integer greater than one, and wherein said added set of payload information comprised in said coded additional data packet comprises a checksum based upon a maximum distance separable block code.

10. The method of claim 6 wherein said added set of payload information comprised in said additional one of said data packets has been interleaved with one or more other added sets of payload information which are based on data packets other than said two or more of said previous data packets.

11. An apparatus for coding a sequence of data packets representing a continuous stream of information, each data packet comprising a set of payload information representative of a segment of said stream of information corresponding thereto, each set of payload information having been similarly divided into a plurality of corresponding individual payload information portions, the apparatus comprising:
  a coder which codes each of a plurality of said data packets by coding said set of payload information comprised therein by coding at least one of said plurality of individual payload information portions thereof; and
  a coder which codes an additional one of said data packets, said additional data packet being subsequent in said sequence to each of said plurality of data packets, said plurality of data packets thereby being previous to said additional data packet, by coding said set of payload information comprised therein, said coded additional data packet further comprising an added set of payload information which provides forward error correcting capability for said payload information comprised in said plurality of previous data packets, wherein said added set of payload information comprised in said coded additional data packet is based on a combination of said payload information comprised in two or more of said previous data packets, and wherein said payload information comprised in at least two of said previous data packets upon which said added set of payload information is based comprises payload information from different individual payload information portions thereof.

12. The apparatus of claim 11 wherein said sets of payload information comprised in each data packet to be coded have been similarly divided into m corresponding individual payload information portions where m is an integer greater than one, and wherein said added set of payload information comprised in said coded additional data packet comprises a checksum of m different individual payload information portions of m of said plurality of data packets, said checksum based upon a single parity check block code, thereby resulting in a rate $m/(m+1)$ forward error correcting code.

13. The apparatus of claim 12 wherein m is equal to 2 and wherein said added set of payload information comprised in said coded additional data packet comprises a checksum of a first individual payload information portion of a first one of said plurality of data packets and a second individual payload information portion of a second one of said plurality of data packets, thereby resulting in a rate 2/3 forward error correcting code.

14. The apparatus of claim 11 wherein said sets of payload information comprised in each data packet to be coded have been similarly divided into m corresponding individual payload information portions where m is an integer greater than one, and wherein said added set of payload information comprised in said coded additional data packet comprises a checksum based upon a maximum distance separable block code.

15. The apparatus of claim 11 wherein said added set of payload information comprised in said additional one of said data packets is interleaved with one or more other added sets of payload information which are based on data packets other than said two or more of said previous data packets.

16. An apparatus for decoding a coded sequence of data packets in response to an erasure of one or more of said data packets in said sequence, said sequence of data packets representing a continuous stream of information and including coded forward error correcting data therefor, each coded data packet comprising a set of payload information similarly divided into a plurality of corresponding individual payload information portions thereof, two or more of said individual payload information portions of each data packet representative of a corresponding segment of said stream of information and another one or more of said individual payload portions of each data packet representative of said forward error correcting data, the coded sequence of data packets having been coded by an apparatus comprising (a) a coder which codes each of a plurality of said data packets by coding said set of payload information comprised therein by coding at least one of said plurality of individual payload information portions thereof, and (b) a coder which codes an additional one of said data packets, said additional data packet being subsequent in said sequence to each of said plurality of data packets, said plurality of data packets thereby being previous to said additional data packet, by coding said set of payload information comprised therein, said coded additional data packet further comprising an added set of payload information representative of said forward error correcting data capability for said payload information comprised in said plurality of previous data packets, wherein said added set of payload information comprised in said coded additional data packet is based on a combination of said payload information comprised in two or more of said previous data packets, and wherein said payload information comprised in at least two of said previous data packets upon which said added set of payload information is based comprises payload information from different individual payload information portions thereof, the apparatus for decoding comprising a decoder which decodes said coded additional one of said data packets, said additional one of said data packets being subsequent in said sequence to at least one of said erased data packets, to generate at least one of said individual payload information portions thereof representative of said forward error correcting data, and which reproduces said at least one of said erased data packets based on at least said generated individual payload information portion of said decoded additional one of said data packets.

17. The apparatus of claim 16 wherein said sets of payload information comprised in each coded data packet have been similarly divided into m corresponding individual payload information portions where m is an integer greater than one, and wherein said added set of payload information comprised in said coded additional data packet comprises a checksum of m different individual payload information portions of m of said plurality of data packets, said checksum based upon a single parity check block code, thereby resulting in a rate $m/(m+1)$ forward error correcting code.

18. The apparatus of claim 17 wherein m is equal to 2 and wherein said added set of payload information comprised in said coded additional data packet comprises a checksum of a first individual payload information portion of a first one of said plurality of data packets and a second individual payload information portion of a second one of said plurality of data packets, thereby resulting in a rate 2/3 forward error correcting code.

19. The apparatus of claim 16 wherein said sets of payload information comprised in each coded data packet have been similarly divided into m corresponding individual payload information portions where m is an integer greater than one, and wherein said added set of payload information comprised in said coded additional data packet comprises a checksum based upon a maximum distance separable block code.

20. The apparatus of claim 16 wherein said added set of payload information comprised in said additional one of said data packets has been interleaved with one or more other added sets of payload information which are based on data packets other than said two or more of said previous data packets.

* * * * *